(12) United States Patent
Reuter et al.

(10) Patent No.: US 12,146,709 B2
(45) Date of Patent: Nov. 19, 2024

(54) DEVICE AND METHOD FOR FREEZE-DRYING

(71) Applicant: OPTIMA pharma GmbH, Schwäbisch Hall (DE)

(72) Inventors: Stephan Reuter, Kassel (DE); Alexander Tambovzev, Offenburg (DE); Matthias Kopp, Crailsheim (DE)

(73) Assignee: OPTIMA pharma GmbH, Schwäbisch Hall (DE)

( * ) Notice: Subject to any disclaimer, the term of this patent is extended or adjusted under 35 U.S.C. 154(b) by 678 days.

(21) Appl. No.: 17/290,643

(22) PCT Filed: Oct. 22, 2019

(86) PCT No.: PCT/EP2019/078748
§ 371 (c)(1),
(2) Date: Apr. 30, 2021

(87) PCT Pub. No.: WO2020/088993
PCT Pub. Date: May 7, 2020

(65) Prior Publication Data
US 2021/0389050 A1    Dec. 16, 2021

(30) Foreign Application Priority Data

Nov. 2, 2018 (DE) .......................... 102018218758.4

(51) Int. Cl.
*F26B 3/347* (2006.01)
*F26B 5/06* (2006.01)
(Continued)

(52) U.S. Cl.
CPC ................ *F26B 3/347* (2013.01); *F26B 5/06* (2013.01); *H05B 6/72* (2013.01); *H01L 23/66* (2013.01); *H01L 2223/6677* (2013.01)

(58) Field of Classification Search
CPC ... F26B 5/06; F26B 3/347; H05B 6/72; H01L 23/66; H01L 2233/6677
(Continued)

(56) References Cited

U.S. PATENT DOCUMENTS

| 4,435,629 A | 3/1984 | Ishimaru et al. |
| 7,334,346 B2 | 2/2008 | Nomine |

(Continued)

FOREIGN PATENT DOCUMENTS

| CN | 106720293 A | 5/2017 |
| CN | 108260241 A | 7/2018 |

(Continued)

OTHER PUBLICATIONS

International Search Report issued in connection with PCT/EP2019/078748.

*Primary Examiner* — Stephen M Gravini
(74) *Attorney, Agent, or Firm* — Akerman LLP

(57) ABSTRACT

The invention relates to a device and a method for freeze-drying products, wherein products are arranged in a drying chamber (2) for a freeze-drying process, wherein energy is supplied to the products arranged in the drying chamber (2) by means of microwaves at least during some parts of the freeze-drying process, and wherein the microwaves are generated by at least one microwave module (6) based on semiconductor technology. The invention also relates to the use of a microwave module (6) based on semiconductor technology in a freeze-drying process.

9 Claims, 2 Drawing Sheets

(51) Int. Cl.
*H01L 23/66* (2006.01)
*H05B 6/72* (2006.01)

(58) Field of Classification Search
USPC .................................................. 34/92, 429
See application file for complete search history.

(56) References Cited

U.S. PATENT DOCUMENTS

| | | | |
|---|---|---|---|
| 9,863,699 B2 * | 1/2018 | Corbin, III | A61M 1/0209 |
| 10,667,547 B2 * | 6/2020 | Born | A23L 3/48 |
| 10,865,131 B2 * | 12/2020 | Ekstrand | C02F 11/13 |
| 11,105,555 B2 * | 8/2021 | Matsumoto | F26B 5/06 |
| 11,143,454 B2 * | 10/2021 | Triglia, Jr. | F26B 3/347 |
| 11,340,014 B2 * | 5/2022 | Trout | A61K 9/19 |
| 2021/0389050 A1 * | 12/2021 | Reuter | H05B 6/72 |

FOREIGN PATENT DOCUMENTS

| | | | | |
|---|---|---|---|---|
| CN | 108311072 A | | 7/2018 | |
| CN | 108362089 A | | 8/2018 | |
| DE | 4240104 A1 | | 6/1994 | |
| DE | 102018218758 A1 | * | 5/2020 | ............. F26B 25/06 |
| KR | 20210089679 A | * | 7/2021 | |
| WO | WO-2020088993 A1 | * | 5/2020 | ............. F26B 25/06 |

* cited by examiner

DEVICE AND METHOD FOR FREEZE-DRYING

CROSS-REFERENCE TO RELATED APPLICATIONS

This application is a national phase of PCT/EP2019/078748, filed Oct. 22, 2019, and claims priority to German Patent Application No. 10 2018 218 758.4, filed Nov. 2, 2018, the entire contents of both of which are hereby incorporated by reference.

FIELD OF APPLICATION AND PRIOR ART

The invention relates to a device and a method for freeze-drying.

Many pharmaceutical products are either too unstable or have an insufficient lifetime in liquid form. Freeze-drying, also referred to as lyophilization or sublimation drying, is a method for carefully drying these products, in particular pharmaceutical products or biotech products, for example vaccines, or foodstuffs, for example for producing milk powder.

The process involves the product being carefully transferred to a stable state by extraction of liquid under particular, product-specific conditions. The liquid is usually water. Other solvents are also possible, however.

In the context of the application, a solvent-containing product is defined as any preparation which is suitable for freeze-drying. In particular, these are liquid or semi-solid aqueous preparations, such as solutions, emulsions or suspensions, for example.

Before the actual drying process, the product is cooled down and frozen, wherein the product is usually cooled to a specific freezing temperature and the freezing temperature is maintained until the solvent content of the product is frozen. Freezing usually occurs at atmospheric pressure. The freezing there is also referred to as crystallization. The onset of freezing is called seed crystal formation or nucleation.

The drying process following the freezing can be divided into a primary drying and a secondary drying stage. During the primary drying stage, pressure is reduced and the solvent contained in the product sublimates at low temperatures, usually below the freezing point. During secondary drying, any solvent which is still bound in the product after primary drying is evaporated. This process is also referred to as desorption.

The quality of the freeze-drying process is significantly influenced by a time profile of the product temperature. An input of heat, i.e. a heating of the product, usually takes place not at atmospheric pressure, but exclusively under vacuum conditions. Due to the highly rarefied atmosphere in the evacuated drying chamber, the thermal conductivity in the gas phase decreases.

Known freeze-drying systems include a drying or product chamber, in which a condenser is arranged or which is connected to a second chamber with a condenser. In the product chamber, a plurality of shelves arranged on top of one another are usually provided, on which vessels, in particular vials, filled with the product to be dried are placed.

Heat is usually supplied or dissipated via the shelves. The shelves are temperature-controlled by a heat transfer fluid, such as silicone oil, flowing in the shelves. Heat transfer to the heat transfer fluid takes place by means of a special cooling/heating module. Heat transfer between a heat transfer fluid passing through the shelves and the products, or between the products and the heat transfer fluid, represents a complex process-control requirement on the design of a freeze-dryer and usually limits a quantity of heat that can be supplied to or extracted from the products. Due to the composition and arrangement of the vessels on the shelf, it is almost impossible to establish a direct contact for conduction of heat between the vessels and the shelves. Heat transfer thus depends primarily on heat convection through a gas in the drying chamber. Another special feature of the heat supply is that the heat is mainly supplied through a base of the vessel. This results in a temperature gradient in the frozen product that remains in place during the freeze-drying process. In conventional freeze dryers therefore, the heat supply under vacuum conditions is not very efficient and can have a negative effect on the overall efficiency of the freeze-drying process.

Object and Solution

An object of the present invention is to create a device and a method which can be used to increase the efficiency of the freeze-drying process.

This object is achieved by the device having the features of claim 1. Advantageous embodiments are described in the dependent claims.

According to a first aspect, a device for freeze-drying products is created, having a drying chamber in which products can be arranged for a freeze-drying process, wherein a microwave module based on semiconductor technology is provided, which is used to generate microwaves for supplying energy to products arranged in the drying chamber during the freeze-drying process.

The energy supply is used in particular to control the temperature of the products, preferably to heat the products for a drying process. Depending on the design, the supply of energy by microwaves takes place during some parts of the freeze-drying process or during the entire freeze-drying process, the energy supplied being variable. One design provides for a reduction in the energy supplied with decreasing residual moisture in the products.

The drying chamber can be suitably designed by the person skilled in the art. In particular, it is designed in such a way that radiation leakage to the environment is avoided. Suitable screening is provided for this purpose, in particular on viewing windows, in sealing areas of doors or the like.

The advantage of the energy supply by microwaves according to the invention is that the energy supply is not affected by conditions in the drying chamber, in particular a prevailing pressure, or at least affected to a lesser extent than with conventional methods. The energy can also be supplied in a more uniform manner than in conventional methods, as the energy input does not predominantly take place via the vessel base and is therefore less dependent on an emissivity of the product, which is usually frozen water with a low emissivity.

At least one microwave module based on semiconductor technology is used to generate the microwaves. One of the advantages of this compared to a magnetron is that fewer components are required and the space requirement is less. The reduced space requirements are particularly noticeable in the size of the components used to generate and radiate the microwaves.

Depending on the design, the energy supply using microwaves is provided in addition to or as an alternative to a conventional energy supply, for example via the shelves arranged in the drying chamber.

In one design, the microwave module comprises at least one microwave control unit, at least one microwave generator, and at least one microwave antenna based on semiconductor technology.

Depending on requirements, for example, a microwave control unit is provided which is connected to one or more microwave generators for signal transmission, each microwave generator being connected to one or more microwave antennas for signal transmission.

The microwave antenna is preferably a component based on semiconductor technology. Microwave antennas based on semiconductor technology can be designed to be smaller than microwave antennas that are not based on semiconductor technology. They can also have different designs. For example, semiconductor-technology based microwave antennas can be designed as PCB antennas, as slot antennas or as patch antennas. Under electrical excitation a microwave antenna develops an electromagnetic field and emits microwaves.

For the purposes of this document the term 'microwave antenna' is understood to mean a microwave antenna based on semiconductor technology, unless otherwise mentioned separately in the following.

In one design, the at least one microwave antenna is arranged in the drying chamber.

The at least one microwave antenna can be mounted at suitable positions in the drying chamber to achieve a uniform radiation distribution. The uniform radiation distribution can be aimed at providing a uniform distribution in the drying chamber. In advantageous designs, an arrangement of the at least one microwave antenna is aimed at achieving a uniform radiation distribution of the microwaves over the products arranged in the drying chamber. In one design, the microwave antennas are alternatively or additionally operated with a frequency and phase shift to ensure homogeneity of the magnetic field.

In one design, the at least one microwave generator and the at least one microwave control unit are arranged outside the drying chamber.

In one design, at least one shelf is provided in the drying chamber, on which the products are placed for a freeze-drying process, the at least one microwave antenna being arranged adjoining to the at least one shelf, in particular adjoining to a flat side of the at least one shelf. In one design, the shelf is used to increase and/or decrease a temperature. In other designs, the shelf serves only as a supporting surface for the products. In contrast to conventional devices, in one design the shelves are made of a non-metallic material.

The flat sides are defined as an upper side of the shelf on which the products are placed, and an underside opposite thereto. In one design, the microwave antenna is arranged on an underside of the shelf, wherein an upper side can be used in a conventional way for heat transport with the vessels that receive the products. In one design, it is provided that the at least one microwave antenna completely covers an upper and/or lower side of the shelf.

In advantageous designs, the microwave generator and the microwave control unit are arranged outside the drying chamber. This eliminates the need for a temperature- and vacuum-resistant design of the microwave generator and the microwave control unit. Furthermore, access to the microwave generator and the microwave control unit is facilitated.

In one design, the at least one microwave control unit is connected to a higher-level control system and at least one lower-level microwave generator for signal transmission.

The microwave control unit preferably communicates with the higher-level control system on the one hand and with the at least one microwave generator on the other. Depending on the design, the communication takes place either by cable or wirelessly. In one design, the microwave control unit is integrated in the higher-level control system of the device and sends or transmits signals to the at least one microwave generator. In a preferred design, a separate microwave control unit is provided, although this is connected to the higher-level control system for the purpose of exchanging data and/or control signals. In an advantageous embodiment the higher-level control system is the control system of a freeze-drying system and controls the freeze-drying process.

The at least one microwave generator is connected to at least one microwave antenna for signal transmission. The microwave generator determines a frequency and power of the microwaves emitted by the microwave antenna. In the context of the application, the frequency and power of the microwaves emitted by the microwave antenna are referred to as the output frequency or output power of the microwave antenna.

The microwave generator preferably exploits and amplifies the signals of the microwave control unit and generates power-related electromagnetic signals for the connected microwave antennas. The microwave antenna converts the power-related electromagnetic signals of the microwave generator into microwaves and emits them in the drying chamber.

In one design, a microwave antenna can optionally be connected by means of different microwave generators for signal reception, wherein an output power and/or an output frequency of the microwave antenna depend(s) on the connected microwave generator.

In advantageous designs, an output power and/or output frequency of the at least one microwave antenna connected to the microwave generator for signal transmission can be adjusted by means of the microwave generator. The microwave module can thus be operated at different operating points.

In one design, the microwave generator can be used to adjust the output power and/or the output frequency of the at least one microwave antenna incrementally and/or continuously. Depending on the application, the adaptation takes place either without feedback of the actual state or with feedback of the actual state. The feedback can be sent to the microwave control unit and/or to the microwave generator. The microwave control unit and/or the microwave generator can then influence the output power and/or the output frequency of the at least one microwave antenna. In one design, it is provided that the output frequency and/or the output power can be adjusted within a defined range. A suitable range can be selected appropriately by the person skilled in the art according to the physical design of the device and/or requirements on the device. In one design, the output power can be adjusted in a range between approximately 10 W and approximately 100 W. In other designs, other ranges are provided according to the specific requirements on the device. Alternatively or additionally, in one design an output frequency can be adjusted in a range between approximately 2.1 and approx. 2.8 GHz. Different ranges are provided in other designs. The adjustable output power and/or the adjustable output frequency enable an energy supply to be varied. In one design, the energy supply for a primary drying process is chosen significantly higher than for a secondary drying process, wherein in one design the energy supply for the secondary drying is a maximum of 30%, in particular a maximum of 10%, of the energy supply for the primary drying.

In one design, only one microwave generator is provided. In advantageous designs, a plurality of microwave generators are provided, each of which is connected to at least one microwave antenna for signal transmission.

In one design, the at least one microwave generator is connected to a plurality of microwave antennas for signal transmission. Preferably, output powers and/or output frequencies of the microwave antennas connected for signal transmission can be adjusted independently of one another by means of the microwave generator.

Independently adjustable output powers and/or output frequencies of a plurality of microwave antennas enable not only the uniform radiation distribution, but also a range-dependent intensity adjustment of the microwaves in the drying chamber, and thus a range-dependent adjustment of the temperatures of the products in the drying chamber. In advantageous designs, the radiation of the microwaves and the action of the microwaves can be adjusted for each product and product range. This means that it is preferably possible to influence a temperature that should prevail in the respective product range of a product.

In one design, the at least one microwave control unit can be connected to a plurality of microwave generators for signal transmission.

Depending on the design, the device comprises, for example, a plurality of microwave generators, each of which is connected to one, two or more microwave antennas for signal transmission. Each microwave generator is assigned its own microwave control unit in one design. For example, coordination between the microwave control units is performed only indirectly by means of the higher-level control system. In other designs, a common microwave control unit is assigned to a plurality or all of the microwave generators. In one design, the microwave antennas of a microwave generator are controlled jointly. In other designs, the output power and/or the output frequency are individually adjusted for each microwave antenna of a microwave generator.

The device also comprises a condenser. In one design, the condenser is arranged in the drying chamber. In other designs, the device comprises a condenser chamber in which the condenser is arranged. In this case, in advantageous designs the drying chamber and the condenser chamber are arranged so as to prevent microwaves from being coupled into the condenser chamber. Alternatively or additionally, the drying chamber and the condenser chamber can be temporarily separated from each other. In particular, in one design it is provided that a connection opening between the condenser chamber and the drying chamber has screening that prevents penetration of microwaves into the interior of the condenser chamber.

The device preferably further comprises a vacuum pump, by means of which the pressure in the drying chamber can be lowered. In one design, the vacuum pump is directly connected to the drying chamber by means of a valve. In other designs, the drying chamber is fluidically connected to the vacuum pump via the condenser chamber, wherein the drying chamber and the condenser chamber are connected to each other either permanently or separably as required.

According to a second aspect, a method for freezing-drying products in a drying chamber is created, wherein products are arranged in the drying chamber for a freeze-drying process, wherein energy is supplied to the products arranged in the drying chamber by means of microwaves at least during part of the freeze-drying process, and wherein the microwaves are generated by at least one microwave module based on semiconductor technology comprising at least one microwave antenna based on semiconductor technology.

The at least one microwave antenna is preferably arranged in the drying chamber. Energy is supplied by microwaves, advantageously under vacuum conditions. In one design, the products are heated exclusively by the energy supplied by means of microwaves. In other designs, heat is additionally supplied via heat emitters provided in the drying chamber, in particular via shelves.

In one design, an output power and/or an output frequency of the at least one microwave antenna is varied during at least some parts of the freeze-drying process.

In one design, the microwaves are emitted by means of a plurality of microwave antennas based on semiconductor technology, wherein output powers and/or output frequencies of the microwave antennas are adjusted independently of each other during at least some parts of the freeze-drying process.

According to a third aspect, the use of at least one microwave module based on semiconductor technology to generate microwaves for supplying energy to products in a freeze-drying process is created.

BRIEF DESCRIPTION OF THE DRAWINGS

Further advantages and aspects of the invention are derived from the claims and from the following description of preferred exemplary embodiments of the invention, which are explained below by reference to the figures. In the drawings:

DETAILED DESCRIPTION OF THE EXEMPLARY EMBODIMENTS

Figure 1:
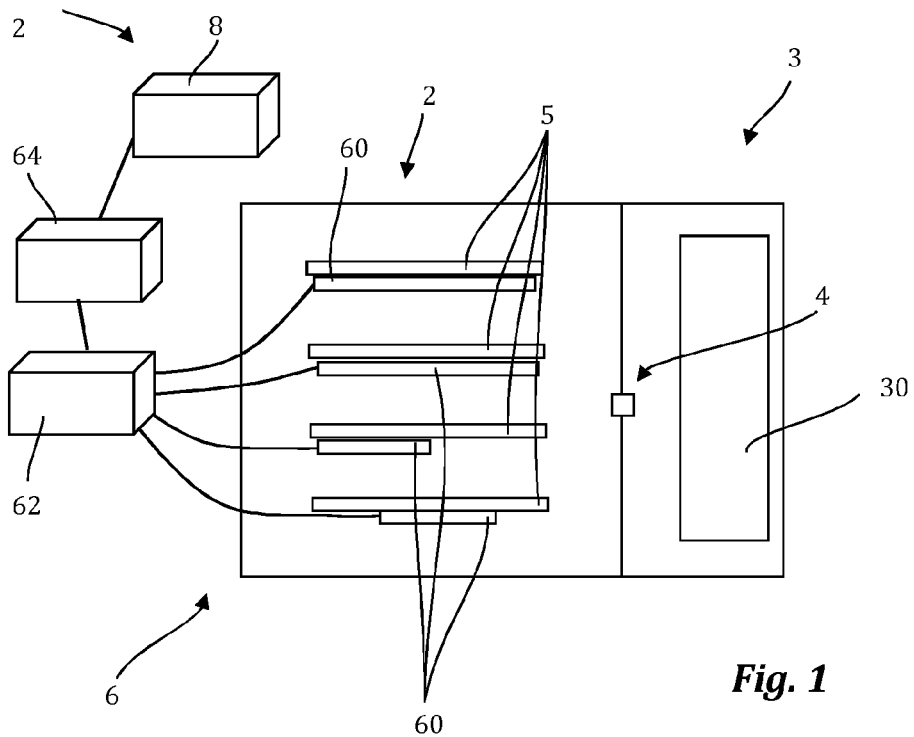
FIG. 1: shows a schematic view of a first exemplary embodiment of a device for freeze-drying according to the invention.

FIG. 1 shows a schematic view of a device 1 for freeze-drying, comprising a drying chamber 2 and a condenser chamber 3 with a condenser 30. In the exemplary embodiment shown, the drying chamber and the condenser chamber 3 are connected via an intermediate valve 4. In other designs, no intermediate valve 4 is provided. In other designs again, the condenser 30 is arranged in the drying chamber 2.

A plurality of shelves 5 are provided in the drying chamber 2, wherein four shelves 5 are shown in FIG. 1 as an example. However, the number of shelves 5 can vary depending on the application. Products that are to undergo the freeze-drying process are placed on the shelves 5 in vials, for example (not shown).

Device 1 also comprises a microwave module 6 based on semiconductor technology, having a plurality of microwave antennas 60, a microwave generator 62 and a microwave control unit 64.

In the exemplary embodiment shown, only one microwave generator 62 is provided, wherein the microwave antennas 64 are each connected to the microwave generator 62 for signal reception. The number and arrangement of the microwave antennas 62 connected to the microwave generator 62 can be selected by the person skilled in the art according to the requirements. In one design, all microwave antennas 64 provided in a device 1 are designed identically. In other designs, the microwave antennas 64 of a device 1—as shown in FIG. 1—are designed differently. In a different design, a plurality of microwave generators 62 are provided, wherein the number and/or arrangement of the microwave antennas 64 connected to a microwave generator 62 can be different. The microwave generator 62 is controlled by means of the microwave control unit 64. If a plurality of microwave generators 62 are provided, these can each be assigned to a separate microwave control unit 64 or assigned to a central microwave control unit 64 in groups or in their entirety.

In the exemplary embodiment shown in FIG. 1, the microwave antennas 60 are each arranged adjoining to a shelf 5, below the shelf 5. In one design, a microwave antenna 60 is assigned to each shelf 5. In other designs—as shown in FIG. 1—microwave antennas 60 are provided only on some of the shelves 5.

In the design shown in FIG. 1, the microwave antennas 60 are connected to the microwave generator 62 via conductors, such as cables, for example. In other designs, a signal transmission can also be implemented wirelessly, for example. The implementation of the signal transmission via cables—as shown in FIG. 1—between the individual microwave antennas 64 and the microwave generator 62 allows the transmission of power-related electromagnetic signals from the microwave generator 62 to the microwave antennas 64. An output power and/or an output frequency can be adjusted by means of the microwave generator 62 and the microwave antennas 64 therefore emit microwaves with a defined power and/or frequency in the drying chamber 2.

The microwave generators 62 are connected to the microwave control unit 64 wirelessly and/or using conductors, via a communication interface in each case.

The microwave control unit 64 communicates information to the microwave generator 62 as to how the output power and/or an output frequency of the microwave antennas 64 should be adjusted. To do this, in one design the output powers and/or output frequencies of all microwave antennas 64 are adjusted separately. In other designs, a group-by-group adjustment occurs, wherein microwave antennas 64 in a group are connected to one microwave generator 62 or are distributed over more than one microwave generator 62.

The device 1 preferably comprises further devices known from conventional devices for freeze-drying, not described further, such as a cooling/heating module for temperature control of the shelves 5 and/or a heat exchanger of the condenser 30, a vacuum module for evacuating the drying chamber 2 and/or a ventilation system, which is used, for example, both for ventilation of the device 1 and adjustment of the pressure during the freeze-drying process.

The device 1 comprises a higher-level control system 8, wherein, in the exemplary embodiment shown, the microwave control unit 64 is connected to the higher-level control system 8 for the exchange of data and/or control signals.

For example, the higher-level control system 8 is designed as a SCADA system. In particular, it is used to control and monitor relevant process steps of the freeze-drying process, including subsidiary process steps, such as automatic cleaning and sterilization.

The freeze-drying process comprises, for example, the following process steps:
1. Load product
2. Cool, freeze and under-cool the product to a specific temperature
3. Evacuate down to a defined pressure
4. Heat the product to a defined temperature
5. Seal the product (necessary if the product has been freeze-dried in sealable containers, e.g. glass vessels with stoppers)
6. Unload product
7. Prepare the freeze-dryer for the next process.

According to the invention, at least during parts of the freeze-drying process, energy is supplied to the products arranged in the drying chamber 2 via microwaves generated by means of the microwave module 6 based on semiconductor technology, which comprises at least one microwave antenna 64 based on semiconductor technology. Depending on the application, the energy supply can, for example, replace or supplement an energy supply by conventional temperature control of the shelves 5.

Preferably, energy is supplied by means of radiant heat input from the microwaves, at least for heating the products under vacuum.

Figure 2:
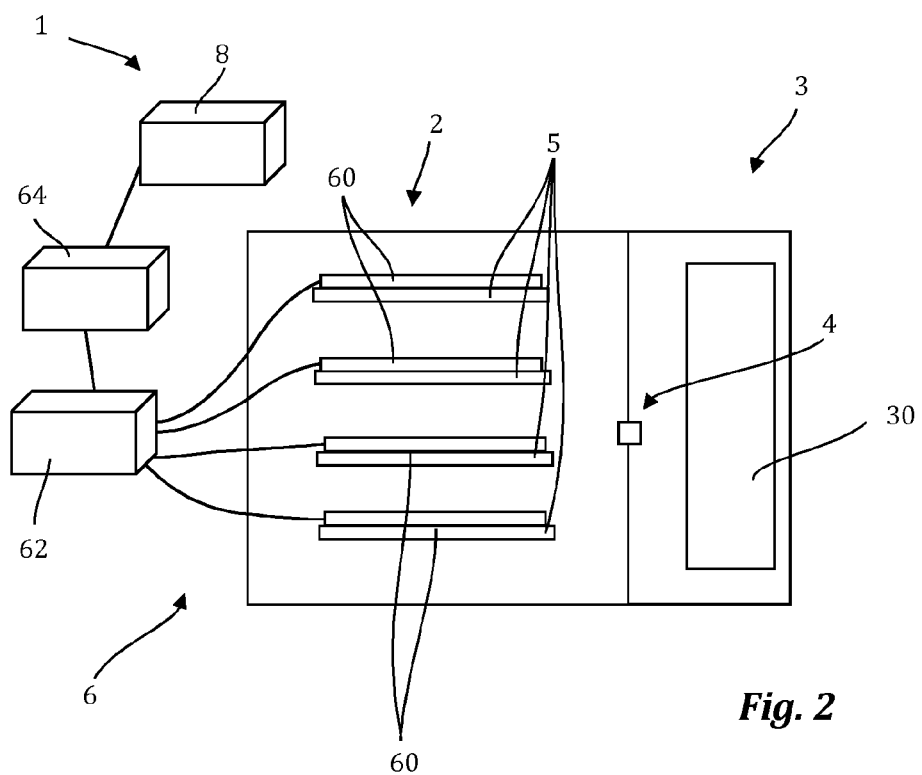
FIG. 2: shows a schematic view of a second exemplary embodiment of a device for freeze-drying according to the invention.
Figure 3:
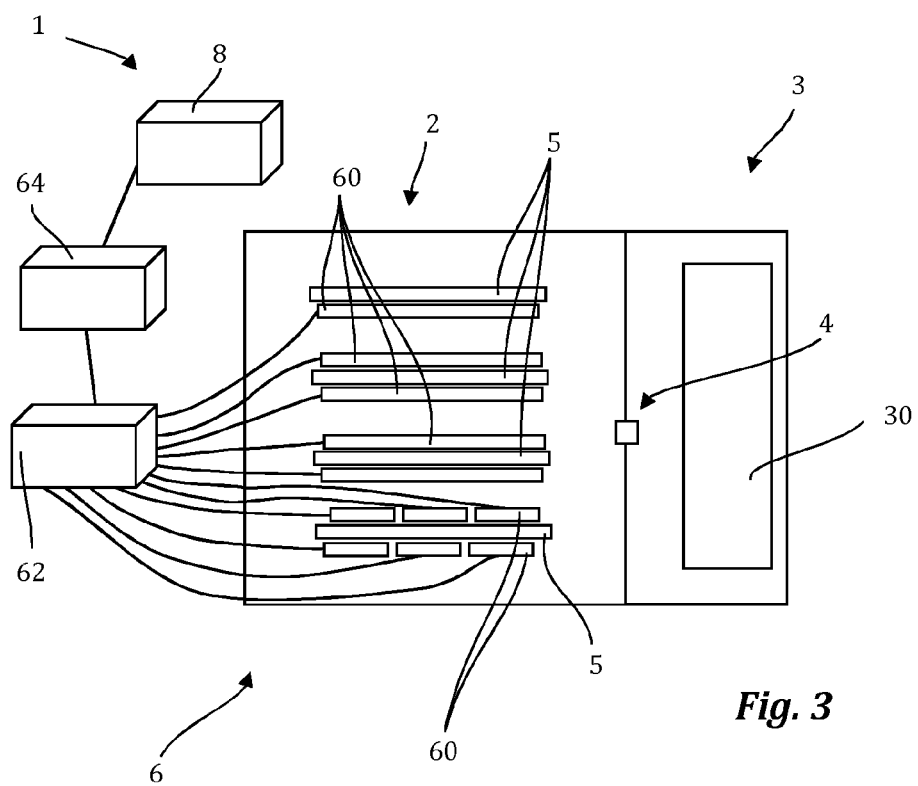
FIG. 3: shows a schematic view of a third exemplary embodiment of a device for freeze-drying according to the invention.

FIGS. 2 and 3 show two further exemplary embodiments of devices 1 for freeze-drying with semiconductor-technology based microwave antennas 64 for generating microwaves to supply energy to products present in drying chambers 2.

The devices 1 according to FIGS. 2 and 3 are similar to the device 1 according to FIG. 1. Corresponding reference signs are used for identical or similar components and for a description, refer to the text above.

The microwave antennas 64 here are also each connected to at least one microwave generator 62. In contrast to the design according to FIG. 1, in the devices 1 according to FIG. 2, the microwave antennas 62 are arranged above the shelves 5, adjoining to them. In the case of the devices 1 according to FIG. 3, the microwave antennas 64 are arranged both above and below the shelves 5 and adjoining to them.

In the exemplary embodiment shown in FIG. 3, a plurality of microwave antennas 64 are provided on a shelf 5, in the drawing the lowest shelf 5, which are arranged both above and below the lowest shelf 5. Each of these microwave antennas is separately connected to the microwave generator 62. The illustration represents only one example. In an alternative design, a plurality of microwave antennas 64 may also be provided on some or all of the shelves 5.

In all the exemplary embodiments shown, the microwave antennas 64 are arranged in a drying chamber 2 and connected for signal reception to at least one microwave generator 62 located outside the drying chamber 2. The microwave antennas 64 in this case are mounted on or under the shelves 5. This design is advantageous because it is simple to assemble. In addition, it is possible to equip already existing devices in the same way using the microwave antennas 64. However, other designs are also possible, in which the microwave antennas 64 are integrated, for example, in the shelves 5 and/or in wall elements of the drying chamber 2.

The exemplary embodiments illustrated are merely examples and do not limit the subject matter defined by the claims. In particular, the size of the drying chamber 2 and the number of shelves 5, as well as the arrangement and number of microwave antennas 64 on the shelves 5, the number of microwave generators 62 and their connection to the microwave antennas 64, and the number of microwave control units 64 are only examples.

The invention claimed is:

1. A device for freeze-drying products having a drying chamber in which products can be arranged for a freeze-drying process,
   wherein a microwave module based on semiconductor technology is provided, by means of which microwaves can be generated for supplying energy to the products arranged in the drying chamber during the freeze-drying process,
   wherein the microwave module comprises at least one microwave control unit, at least one microwave generator, and at least one microwave antenna,
   wherein the at least one microwave antenna is based on semiconductor technology,
   wherein the at least one microwave antenna is arranged in the drying chamber, and
   wherein the at least one microwave generator and the at least one microwave control unit are arranged outside the drying chamber.

2. The device as claimed in claim 1, wherein at least one shelf is provided in the drying chamber, on which the products are placed for a freeze-drying process, the at least one microwave antenna being arranged adjoining to the at least one shelf.

3. The device as claimed in claim 1, wherein the at least one microwave control unit is connected to a higher-level control system and at least one lower-level microwave generator for signal transmission.

4. The device as claimed in claim 1, wherein the at least one microwave generator is connected to at least one microwave antenna for signal transmission, wherein an output power and/or an output frequency of the at least one microwave antenna connected for signal transmission is adjustable by means of the at least one microwave generator.

5. The device as claimed in claim 4, wherein the output power and/or the output frequency of the at least one microwave antenna can be adjusted incrementally and/or continuously during operation of the device.

6. The device as claimed in claim 4, wherein the at least one microwave generator is connected to a plurality of microwave antennas for signal transmission, wherein output powers and/or output frequencies of the plurality of microwave antennas connected for signal transmission are adjustable independently of one another by means of the microwave generator.

7. The device as claimed in claim 1, wherein the at least one microwave control unit is connected to a plurality of microwave generators for signal transmission.

8. The device as claimed in claim 1, wherein a condenser chamber with a condenser is provided, wherein the drying chamber and the condenser chamber are arranged relative to each other so as to prevent or at least minimize coupling of microwaves into the condenser chamber.

9. The device as claimed in claim 2, wherein the at least one microwave antenna is arranged on a flat side of the at least one shelf.

* * * * *